(12) United States Patent
Khorram

(10) Patent No.: US 7,149,488 B2
(45) Date of Patent: *Dec. 12, 2006

(54) DIRECT TUNING OF RADIO RECEIVER INTEGRATED CIRCUIT

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/120,560

(22) Filed: May 3, 2005

(65) Prior Publication Data

US 2005/0215219 A1 Sep. 29, 2005

Related U.S. Application Data

(63) Continuation of application No. 10/140,523, filed on May 7, 2002, now Pat. No. 6,915,114.

(51) Int. Cl.
*H04B 1/06* (2006.01)

(52) U.S. Cl. .................. 455/266; 455/340
(58) Field of Classification Search ............ 455/423, 455/425, 67.11, 67.14, 266, 339–340, 226.1, 455/226.2, 195.1, 232.1, 234.1, 234.2
See application file for complete search history.

(56) References Cited

U.S. PATENT DOCUMENTS

| | | | | |
|---|---|---|---|---|
| 5,101,509 A | * | 3/1992 | Lai | 455/183.1 |
| 6,915,114 B1 | * | 7/2005 | Khorram | 455/67.14 |
| 2003/0176174 A1 | * | 9/2003 | Seppinen et al. | 455/226.1 |

* cited by examiner

*Primary Examiner*—Nguyen T. Vo
(74) *Attorney, Agent, or Firm*—Garlick Harrison & Markison; Timothy W. Markison

(57) ABSTRACT

A method for direct tuning of a radio receiver begins by providing a plurality of frequency-dependent control input signals to an input of the radio receiver. The method continues by, for each of a plurality of frequency-dependent control input signals, determining received signal strength of a current one of the plurality of frequency-dependent control input signals to produce a measured received signal strength, determining whether the measured received signal strength is within a threshold of a known signal strength of the current one of the plurality of frequency-dependent control input signals, when the measured received signal strength is not within the threshold of the known signal strength of the current one of the plurality of frequency-dependent control input signals, incrementally adjusting gain of the radio receiver by a predetermined adjustment value until the measured received signal strength is within the threshold of the known signal strength of the current one of the plurality of frequency-dependent control input signals. The method continues by determining response of the radio receiver based on the incrementally adjusting the gain of the radio when the measured received signal strength is not within the threshold of the known signal strength of the current one of the plurality of frequency-dependent control input signals to produce a determined response. The method continues by comparing the determined response with a desired response of the radio receiver. The method continues by, when the determined response compares unfavorably with the desired response, determining a response offset based on a difference between the determined response and the desired response. The method continues by adjusting response of the radio receiver based on the response offset.

12 Claims, 7 Drawing Sheets receiver 100 receiver 130

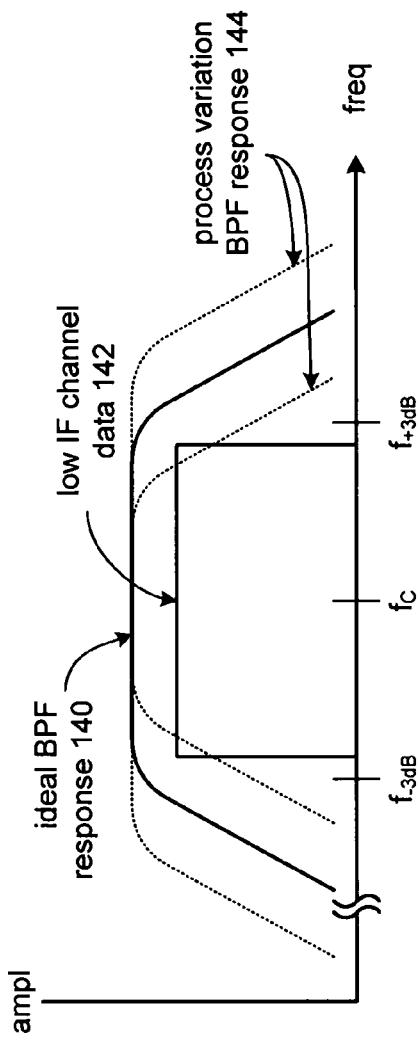
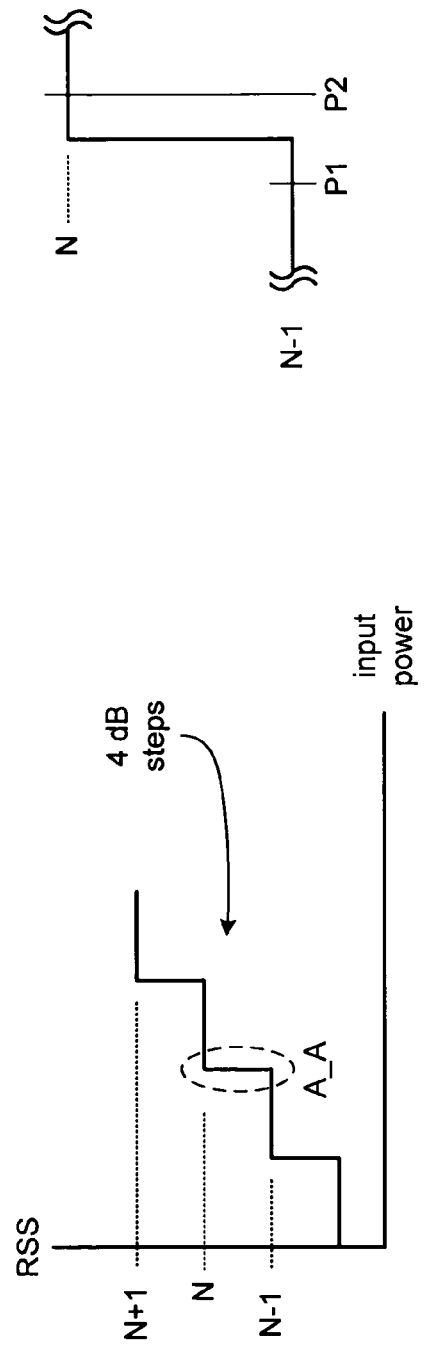

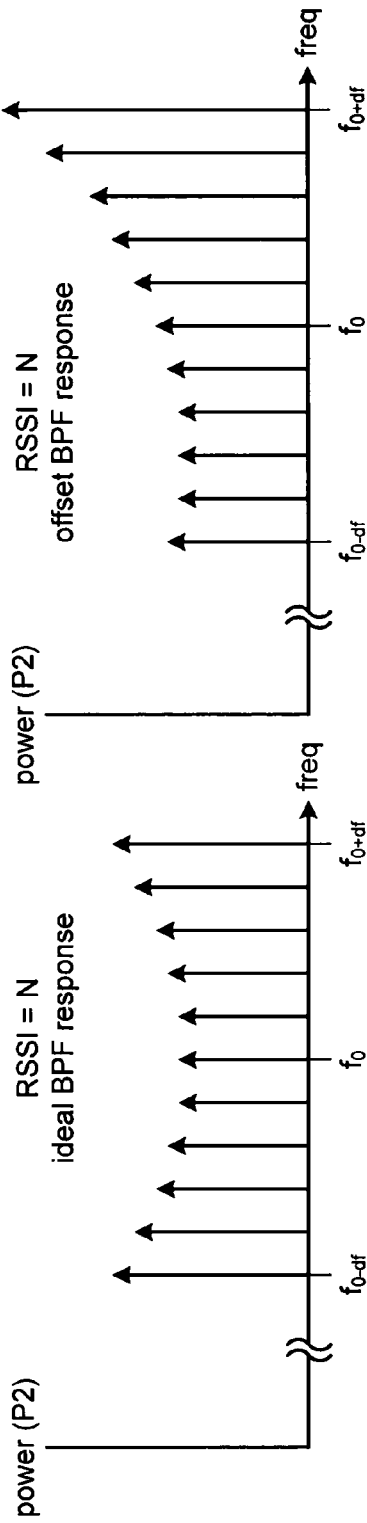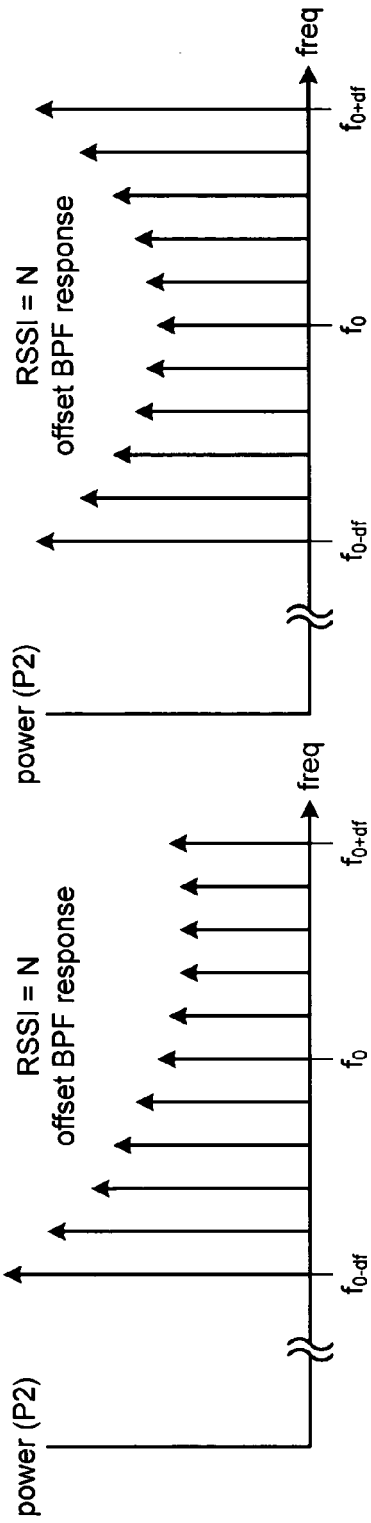

DIRECT TUNING OF RADIO RECEIVER INTEGRATED CIRCUIT

This patent application is claiming priority under 35 USC § 120 as a continuing patent application of patent application entitled DIRECT TUNING OF EMBEDDED INTEGRATED CIRCUIT COMPONENTS, having a filing date of May 7, 2002, now U.S. Pat. No. 6,915,114 and a Ser. No. 10/140,523.

TECHNICAL FIELD OF THE INVENTION

This invention relates generally to wireless communication systems and more particularly to tuning components of radio frequency integrated circuits used in such wireless communication systems and/or other integrated circuits.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. The filtering stage filters the baseband signal or the IF signal to attenuate unwanted out of band signals to produce a filtered signal. The data recovery stage recovers raw data from the filtered signal in accordance with the particular wireless communication standard.

The filtering stage of the receiver may either be a low pass filter or a bandpass filter. In either implementation, the filtering stage functions to pass signals of interest and to attenuate unwanted signals. Typically, the unwanted signals are adjacent channels and/or noise. To ensure that the unwanted signals are sufficiently attenuated, the filtering stage should have a sharp roll-off at its corner frequency or frequencies, the corner frequency or frequencies should be at the desired frequencies, and, for bandpass filters, the center frequency should be at the desired center frequency.

While these are the desired characteristics of the filtering stage, they are very difficult to obtain within radio frequency integrated circuits without some type of process variation compensation. As is known, CMOS technology process variations yield components that have a tolerance of +/−20%. Thus, for a filter that includes a resistor/capacitor (RC) stage, the corner frequency may be off by as much as 20%. If the filter includes multiple RC stages, which is the case to obtain a sharp roll-off, the corner frequency errors increase. For example, for a five RC stage filter, the error may be as much as 100%, yielding an entirely different filter than the one desired.

To compensate for integrated circuit process variations, the RC stages include tunable capacitors (e.g., switchable capacitor banks). In addition, the integrated circuit includes an on-chip calibration circuit that includes its own RC stage to tune the RC stage(s) (i.e., enable the switchable capacitor bank to approximate the desired capacitance). To determine a process error, the calibration circuit provides a pulse signal to its RC stage and measures the RC time constant. The measured RC time constant is compared to a desired RC time constant (which is readily calculable since the resistor and capacitor of the calibration circuit are designed to have a specific value) to determine the process error. Based on the process error, the calibration circuit tunes the RC stages of the filters (e.g., provides a signal which configures the switchable capacitor bank to yield approximately the desired capacitance).

While this approach mitigates the adverse effects of process variation on integrated circuit filters, for high performance circuits, such as an integrated Bluetooth radio, the reduced adverse processing variation effects are still too great. In addition, the unilateral calibration test assumes uniform process variations across the integrated circuit, which may or may not be the case, and adjusts all the components (e.g., capacitors) by the same amount. Thus, in a multiple RC stage filter, it is very difficult to accurately obtain the desired filtering response on a chip-to-chip basis.

Therefore, a need exists for a technique to directly tune a component embedded within an integrated circuit, especially components of a filtering stage in a radio frequency integrated circuit.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

FIG. 5 is a graphical representation of a frequency response of a bandpass filter in accordance with the present invention;

FIG. 6 is a graph of signal strength indication versus input power in accordance with the present invention;

FIG. 7 is an expanded view of a signal strength indication step of FIG. 6;

FIG. 8 is a graph that plots the power of the frequency dependent control signals for an ideal bandpass filter response in accordance with the present invention;

FIG. 9 is a graph that plots the power corresponding to the frequency dependent control signals for a bandpass filter that has its center frequency too low in accordance with the present invention;

FIG. 10 is a graph plotting the power corresponding to the frequency dependent control signals for a bandpass filter that has its center frequency too high in accordance with the present invention;

FIG. 11 is a graph plotting the power corresponding to the frequency dependent control signals for a bandpass filter that is too narrow in accordance with the present invention.

DETAIL DESCRIPTION OF A PREFERRED EMBODIMENT

Figure 1:
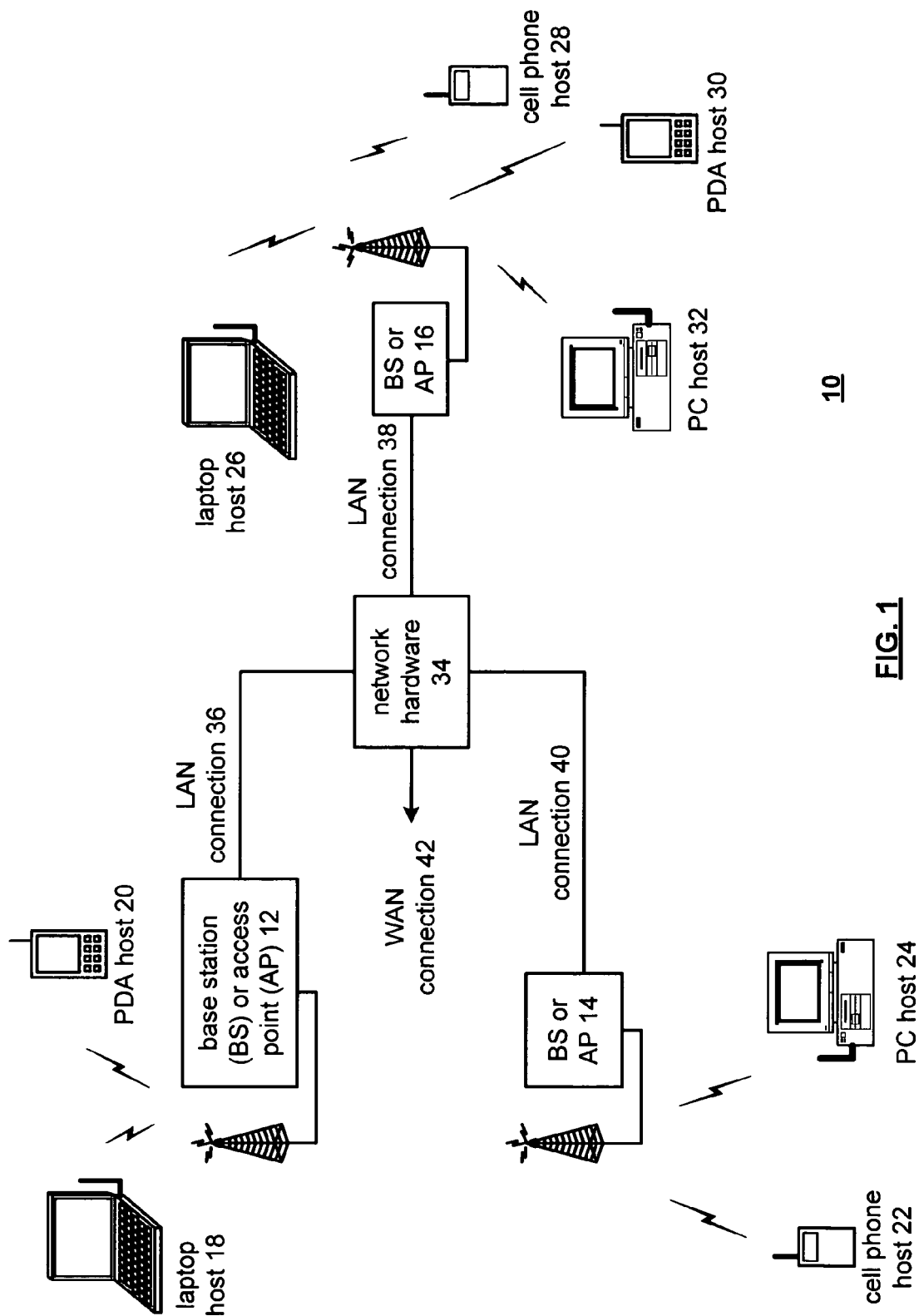
FIG. 1 is a schematic block diagram illustrating a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
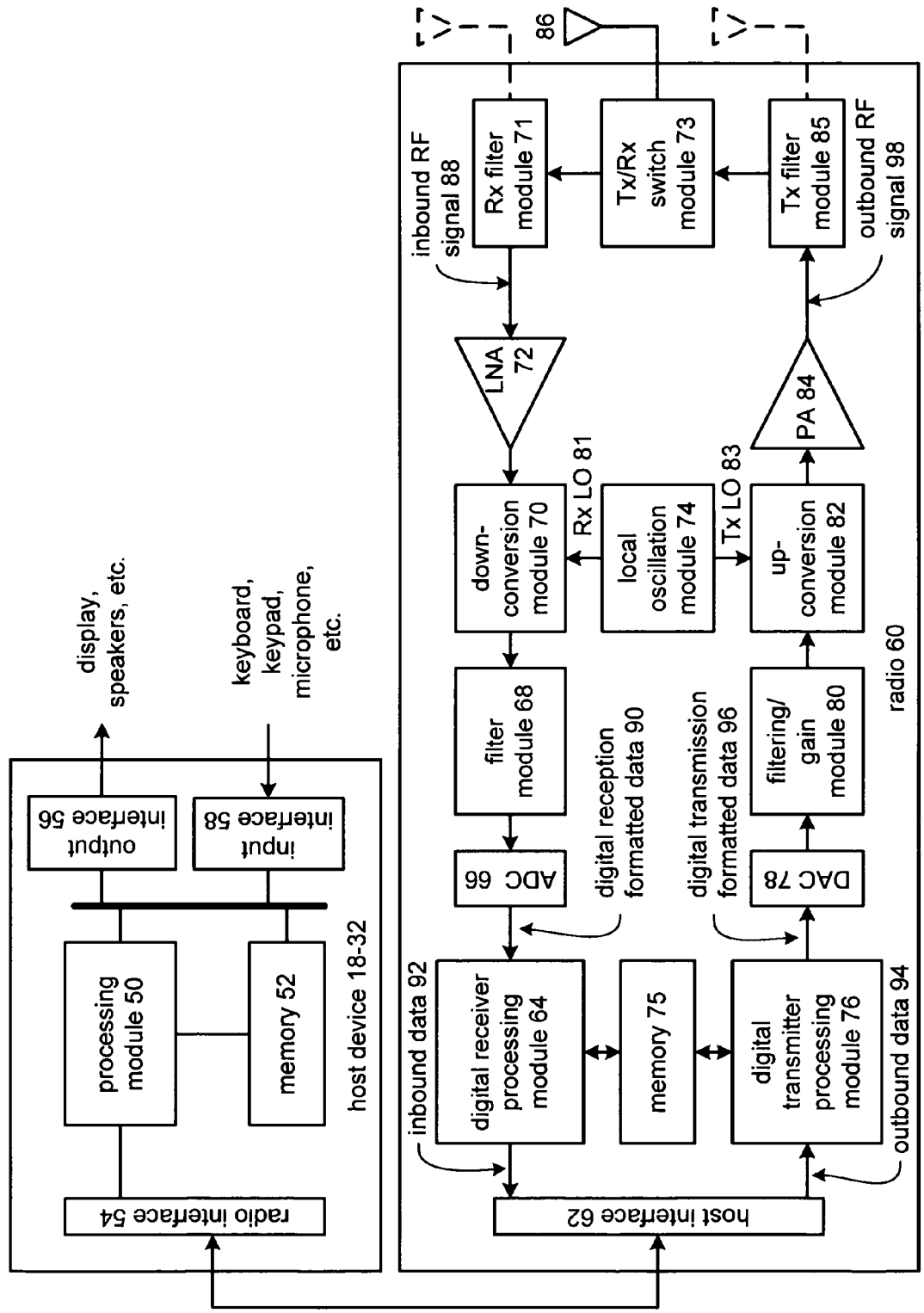
FIG. 2 is a schematic block diagram illustrating a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–12.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filter module 68. The filter module 68 may be implemented in accordance with the teachings of the present invention to filter the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
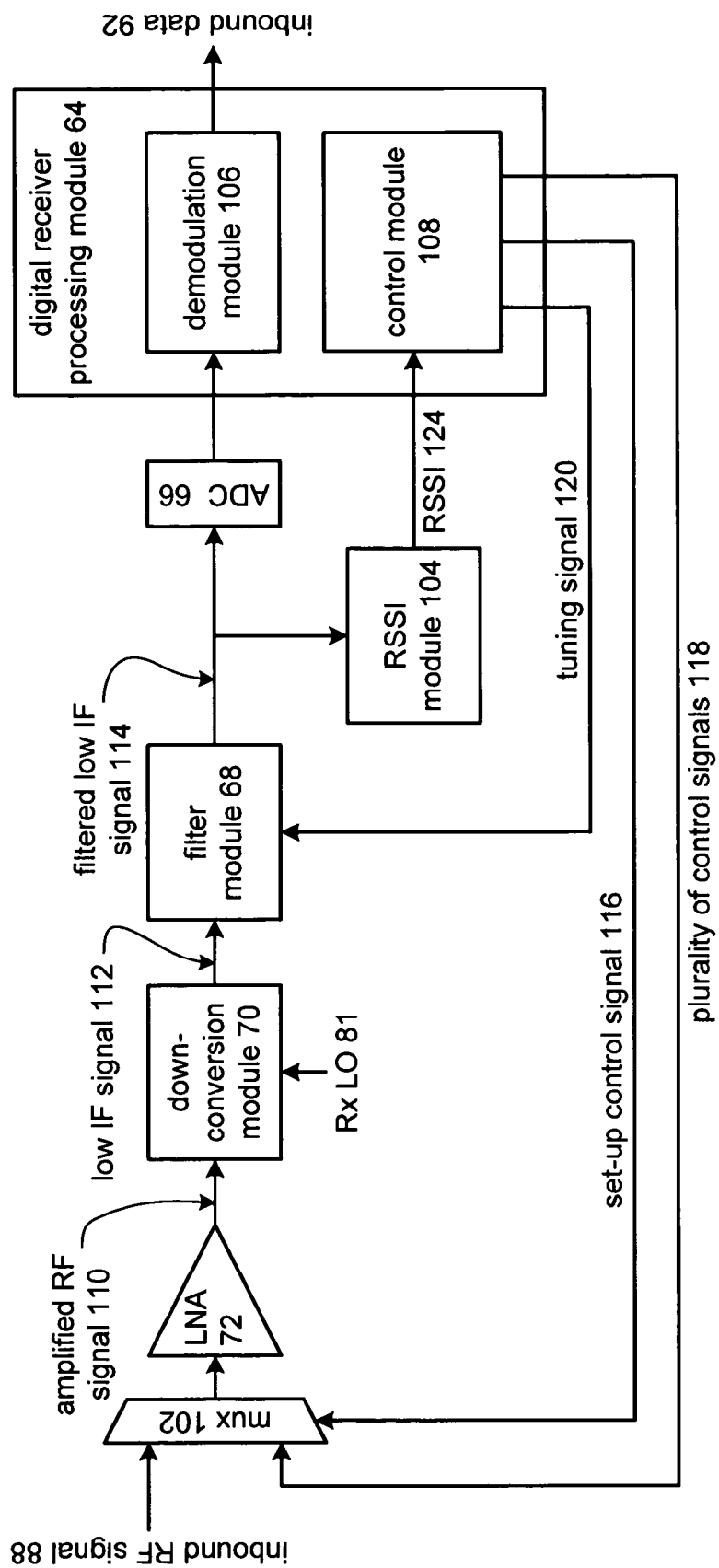
FIG. 3 is a schematic block diagram illustrating a receiver in accordance with the present invention.

FIG. 3 illustrates a more detailed schematic block diagram of an embodiment of the receiver section 100 of the wireless communication device illustrated in FIG. 2. The receiver 100 includes a multiplexor 102, low noise amplifier 72, down conversion module 70, filter module 68, analog to digital converter 66, receive strength signal indication (RSSI) module 104 and the digital receiver processing module 64. The digital receiver processing module 64 is configured to provide a demodulation module 106 and a control module 108.

During normal operation, the multiplexor 102 passes the inbound RF signals 88 to the low noise amplifier 72, which produces amplified radio frequency signals 110, therefrom. The down conversion module 70 mixes the amplified RF signals 110 with a receiver local oscillation 81 to produce low intermediate frequency signals 112. The low intermediate frequency signals 112 may have a carrier frequency ranging from 100 KHz to a few megahertz. For example, in a Bluetooth application, the low IF signal 112 will have a carrier frequency, or intermediate frequency, of approximately 2 MHz.

The filter module 68 filters the low IF signal 112 to produce filtered low IF signal 114. The filtering performed by filter module 68 may be low pass filtering and/or band-pass filtering. The filtering module 68 may includes one or more stages of resistor/capacitor circuits and/or one or more stages of inductor/capacitor circuits. The tuning of the filter module 68 will be described subsequently.

The analog to digital converter 66 converts the filtered low IF signals 114 into digital signals. The demodulation module 106 converts the digital low IF signals into the inbound data 92 in accordance with the particular wireless communication standard being implemented.

During a setup mode, which is used to tune the filter module 68, the multiplexor 102 is configured via the setup control signal 116 to provide a plurality of control signals 118 to the low noise amplifier 72. The control module 108 generates the setup control signal 116 and provides the plurality of control signals 118 in a sequential order to the multiplexor 102.

To establish the tuning signal 120 for filter module 68, the control module 108 provides a $1^{st}$ control signal at a $1^{st}$ power level to the multiplexor 102. The $1^{st}$ control signal at the $1^{st}$ power level is propagated through the receiver 100 until the filtered low IF signal 114 is produced therefrom. The RSSI module 104 measures the signal strength of the filtered low IF signal 114 and provides an RSSI value 124 to the control module 108. If the RSSI value 124 is at the desired level, the control module 108 provides the next control signal at the $1^{st}$ power level to the multiplexor 102. If, however, the RSSI value 124 is not at the desired level, the control module adjusts the power level of the control signal and provides the adjusted power level control signal to multiplexor 102. The adjusted power level control signal is propagated through the receiver until the RSSI module 104 obtains its RSSI value 124. This process continues for the first control signal until the RSSI value 124 is at the desired value. Note that the control module 108 may increase or decrease the power level of the first control signal to adjust the RSSI value to the desired level.

The control module 108 repeats this process for each of the remaining control signals 118. At this point, the control module 108 has acquired a set of power levels for the control signals 118. Based on this set of power levels, the control module 108 compares it with a desired set of power levels. The desired set of power levels corresponds to the desired filter response of filter module 68. Thus, if the measured set of power levels does not sufficiently correspond to the desired set of power levels, the control module 108 generates a tuning signal 120 to adjust one or more resistor capacitor stages and/or one or more inductor capacitor stages of filter module 68. The determination of the tuning signal 120 may be a repetitive process where the control module 108 increments or decrements resistive and/or capacitive values of the resistor capacitor circuits and/or inductive and/or capacitive values of inductor capacitor circuits within filter module 68 and repeats the power level testing with the newly established resistance, capacitance, and/or inductance values. Alternatively, the control module 108 may calculate the differences between the actual power levels and the desired power levels and determine the tuning signal 120 therefrom. As one of average skill in the art will appreciate, the determining of the tuning signal 120 may be done in a variety of ways once the data is obtained from testing the receiver 100 utilizing the plurality of control signals 118 and their corresponding RSSI values 124.

Figure 4:
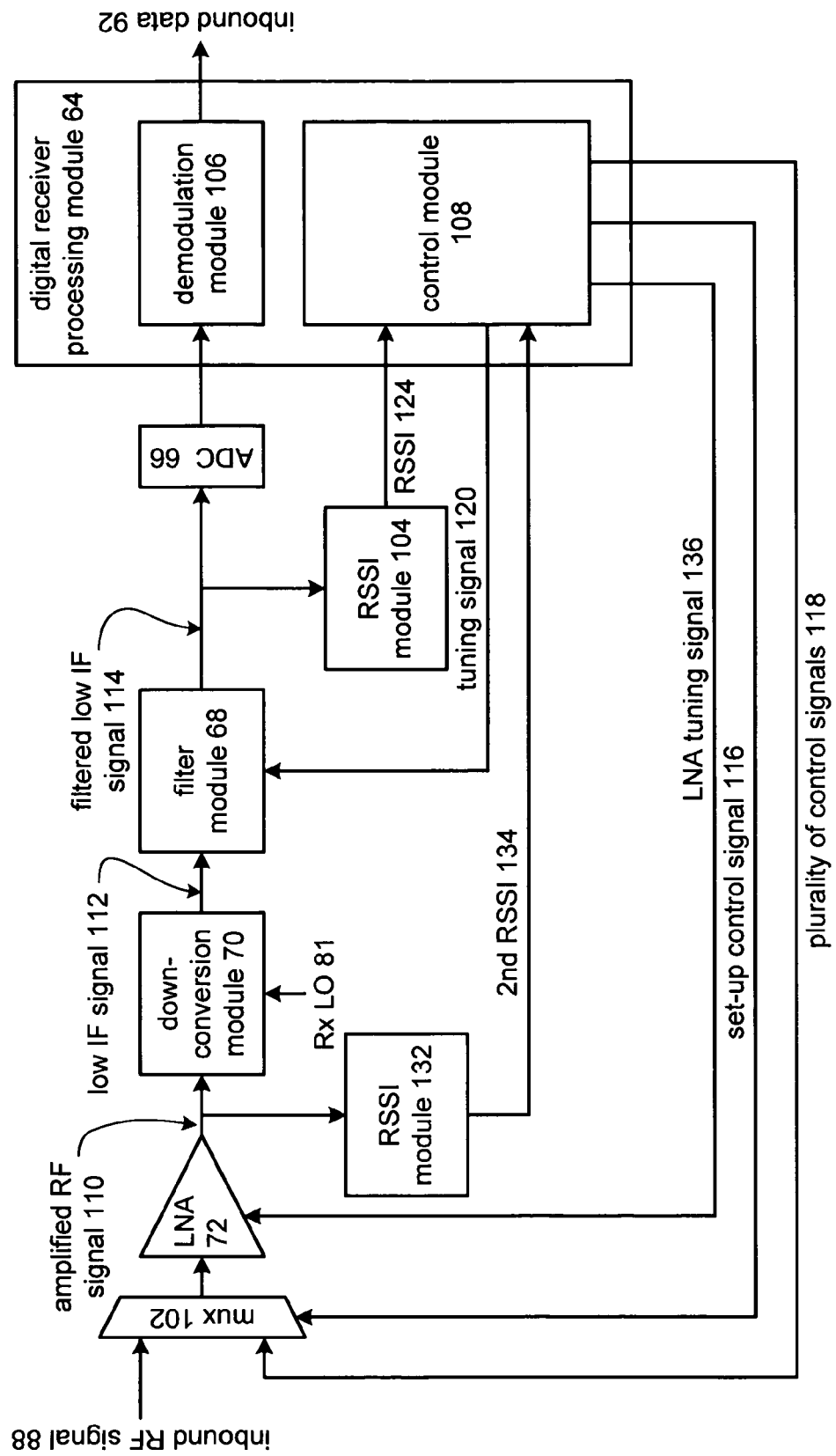
FIG. 4 is a schematic block diagram illustrating an alternate receiver in accordance with the present invention.

FIG. 4 is a schematic block diagram of an alternate receiver 130 that may be used in the wireless communication device of FIG. 2. Receiver 130 includes the multiplexor 102, low noise amplifier 72, down conversion module 70, filter module 68, analog to digital converter 66, digital receiver processing module 64, RSSI module 104, and a $2^{nd}$ RSSI module 132. The digital receiver processing module 64 is configured to include a demodulation module 106 and the control module 108.

During normal operation, the setup control signal 116 enables the multiplexor 102 to pass the inbound RF signals 88 to the low noise amplifier. The processing of inbound RF signals 88 is as previously discussed with reference to FIGS. 2 and 3. In addition, the tuning of the filter module 68, which has the narrowest frequency response of the components in receiver 130, is tuned as previously described with reference to FIG. 3.

To tune the transconductance of transistors within the low noise amplifier, and/or to tune inductor/capacitor circuits within low noise amplifier 72, a $2^{nd}$ RSSI module 132 is used to measure the power level of the output of the low noise amplifier. As such, during testing mode, where the setup control signal 116 causes multiplexor 102 to pass the plurality of control signals 118, the RSSI module 132 measures the power level of the amplified signals produced by low noise amplifier 72. As with the determining of the tuning signal 120 for the filtering module 68, the control module 108 determines whether the $2^{nd}$ RSSI value 134 is at a desired RSSI value. If not, the control module 108 adjusts the power level of the control signal and repeats the determination of the $2^{nd}$ RSSI value 134. The power level of the control signal is adjusted until the $2^{nd}$ RSSI value 134 is at the desired RSSI value. This process repeats for each of the plurality of control signals 118 until a set of power levels is obtained for the control signals 118. Based on this set of power levels, the control module 108 can determine the low noise amplifier tuning signal 136, which adjusts the transconductance of a transistor within the low noise amplifier and/or one or more inductor/capacitor circuits within the low noise amplifier. As one of average skill in the art will appreciate, the tuning of the filter module 68 and the tuning of the low noise amplifier 72 may be done simultaneously or in separate steps.

FIG. 5 is a graph plotting the frequency response of an ideal bandpass filter 140, a low intermediate frequency (IF) channel 142, and integrated circuit process variation affected bandpass filter responses 144. As shown, the ideal bandpass filter response 140 has a center frequency ($f_c$) and begins its roll-off at the 3 dB points ($f_{-3dB}$ and $f_{+3dB}$). The bandpass filter is designed to pass, with negligible attenuation, the low IF channel data 142.

Prior to tuning a bandpass filter, however, the effects caused by process variations may shift the bandpass frequency response 144 to the left, to the right, may narrow it, and/or may widen it. For instance, if the bandpass response 144 is narrowed due to process variations, the edges of the low IF channel data 144 are being attenuated. As such, the ability to accurately recover data contained within the low IF channel 142 is reduced. Similar problems occur when the response is shifted to the left or to the right.

If the bandpass filter response 144 is widened due to process variations, adjacent channel information may not be sufficiently attenuated thus, interfering with the ability to accurately recover data contained in the low IF channel 142. As such, the present invention tunes the filter response for a bandpass filter, low pass filter, or any other type of filter, to more closely resemble the ideal filter response (e.g., bandpass filter response 140).

FIG. 6 is a graph plotting input power to the receiver 100 or 130 versus RSSI. This graph is typical of the RSSI values generated by RSSI module 104 and/or RSSI module 132. As shown, as the input power of a signal increases, the corresponding RSSI value increases. In this illustration, the RSSI value increases at 4 dB steps.

While 4 dB steps are useful to monitor RSSI values for other processing within the receiver 100 or 130, such as adjusting gain of gain stage, the 4 dB steps are too large to accurately tune the filter response. For instance, 4 dB corresponds to a ratio of 1.58 to 1. As previously mentioned, the component tolerance for CMOS technology is approximately 20%. As such, the 1.58 to 1 sensitivity of the RSSI steps is far too insensitive to tune out the 20% variations caused by the CMOS technology. The RSSI modules 104 and 132, however, generate the corresponding RSSI values in a step function like manner. As such, small deviations in power may result in a 4 dB variation in measured RSSI value. By utilizing these step function properties, the power levels corresponding to just before a RSSI value changes to just after it has changed, thus enabling the power levels of the control signals to be accurately measured and providing accurate estimations of the filter response.

Referring to FIG. 7, which provides an expanded view of a step within the RSSI value illustrated in FIG. 6, a first power level (P1) occurs just prior to the transition from RSSI value N−1 to RSSI value N. A second power level (P2) occurs just after the transition from N−1 to N. By establishing the power difference between P1 and P2 to be relatively small, the second power level (P2) has a much greater degree of accuracy than the 4 dB steps. As such, by adjusting the power level for the plurality of control signals to determine P1 and P2 at the RSSI value N, accurate power measurements are obtained for each of the control signals.

FIG. 8 is a graph plotting the power levels (at P2 for RSSI value=N) for the plurality of control signals 118 as measured from the receiver when the filter module 68 includes an ideal bandpass filter response. The center frequency of the control signals ($f_0$) is chosen to be the nominal carrier frequency of the RF signals with control signals spaced at desired frequencies to provide the desired breadth of the frequency sweep. For example, if the radio is being utilized in a Bluetooth application, the bandpass filter will have a center frequency at approximately 1–20 MHz and a bandwidth of approximately 1 MHz. The carrier frequency of the RF carrier signal is approximately 2.4 gigahertz and the channel width is approximately 1 MHz. As such, by ranging the control signals from 2.4 GHz−3 MHz to 2.4 GHZ+3 MHz spaced at a 100 KHz to a few hundred kilohertz an accurate representation of the bandpass filter is obtained.

As shown, for the ideal bandpass filter response the adjusted power levels for each of the frequency dependent control signals will be a mirror image symmetrical around the center frequency $f_0$. For the purposes of illustration, the variations in power levels are exaggerated to illustrate the concepts. As shown, as the frequency changes from the center frequency $f_0$, the power level increases. As such, the corresponding bandpass frequency response is attenuating signals more greatly at the outer edges of the frequency sweep (e.g., $f_{0-df}$ and $f_{0+df}$) than towards the center frequency $f_0$. From the plot of the plurality of control signals, the bandpass filter response may be readily obtained as essentially the inverse of the magnitudes of the power level P2. In addition, the gain of the bandpass filter may be determined based on the magnitude of the power levels P2 for each of the control signals. Accordingly, the gain filter module 68 may also be tuned.

FIGS. 9, 10 and 11 are plots illustrating the power levels of the control signals for various non-ideal bandpass filter responses. For example, FIG. 9 illustrates the corresponding plurality of control signals 118 when the center frequency of the bandpass filter is too low, FIG. 10 illustrates the plurality of control signals when the center frequency of the bandpass filter is too high and FIG. 11 illustrates the response of the bandpass filter when the bandpass filter is too narrow. By comparing the non-ideal responses with the ideal response, a response offset may be obtained based on the magnitude differences between the power levels of the non-ideal responses with respect to the ideal response. In addition, a frequency offset may be obtained by comparing the non-ideal center frequency and/or corner frequencies to the ideal center frequency and/or corner frequencies.

Based on these non-ideal conditions (e.g., the response offset and/or the frequency offset), which may occur in combinations, the control module 108 determines how the bandpass filter needs to be tuned (e.g., increase or decrease capacitance and/or resistance of RC circuits within the filter and/or increase or decrease capacitance and/or inductance of LC circuits within the filter). As one of average skill in the art will appreciate, if the bandpass filter response is too wide, the power level across the sweeping of the plurality of control signals will have minimal deviation thus indicating that the bandpass filter response is too wide. Accordingly, for any of the non-ideal conditions, in comparison with the ideal condition, the filtering module may be tuned.

Similarly, an ideal low noise amplifier response may be obtained and used to determine the tuning of the low noise amplifier with respect to the non-ideal responses that would be obtained during testing.

Figure 12:
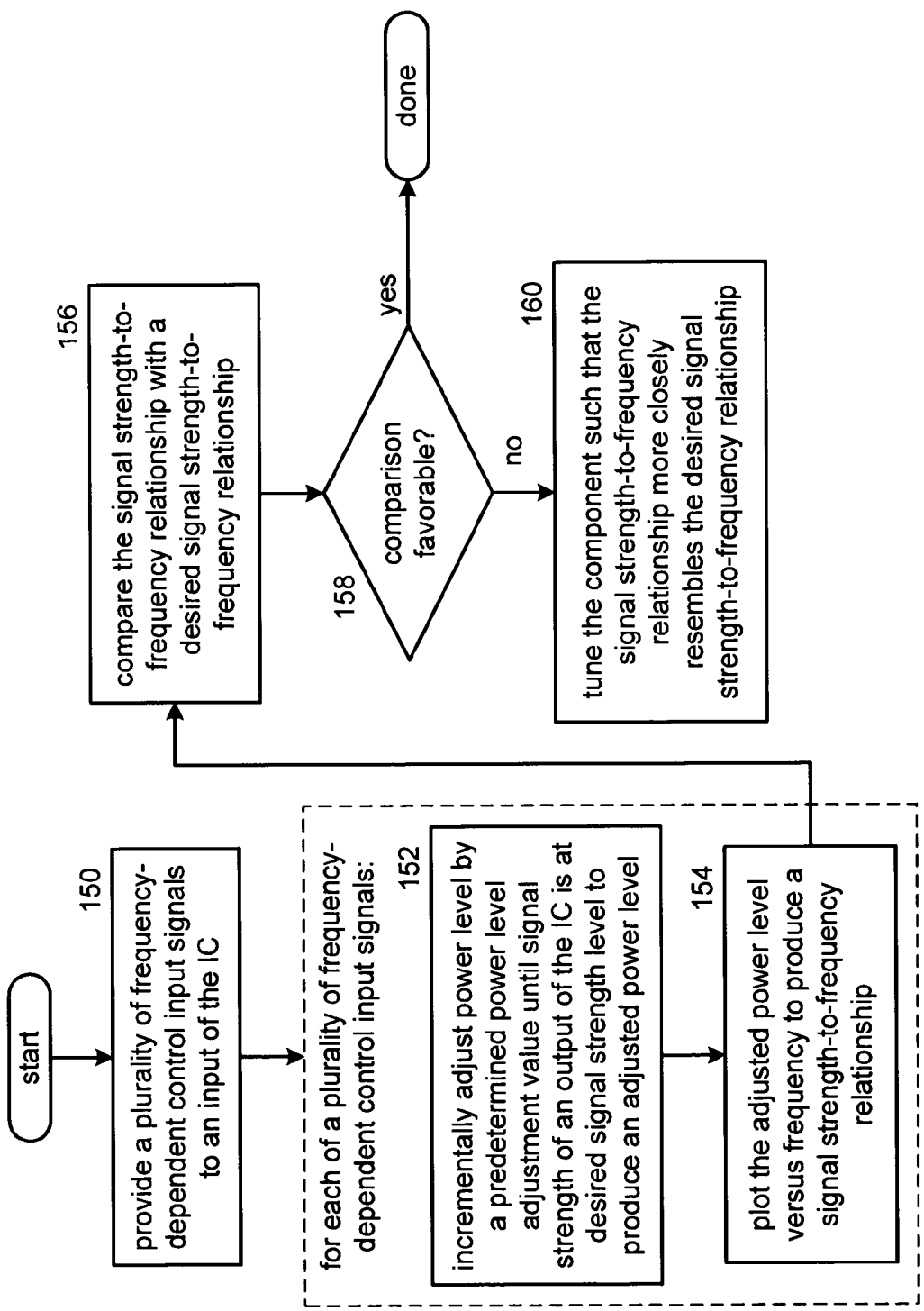
FIG. 12 is a logic diagram illustrating a method for direct tuning of a component embedded within an integrated circuit.

FIG. 12 is a logic diagram of a method for direct tuning of a component embedded within a circuit of an integrated circuit. As such, the component within the circuit does not have direct pin access. The process begins at Step 150 where a plurality of frequency dependent control input signals are provided to an input of the integrated circuit. The component is indirectly coupled to the input of the integrated circuit. As such, the plurality of frequency dependent control input signals are indirectly provided to the component. The process then proceeds to Steps 152 and 154 for each of the plurality of frequency dependent control signals. At Step 152, the power level of each of the plurality of frequency dependent control input signals is incrementally adjusted by a predetermined power level adjustment value until the signal strength of an output of the integrated circuit is at a desired signal strength level to produce an adjusted power level. Note that the component of the circuit is indirectly coupled to the output of the integrated circuit. The incremental adjusting of the power level was previously described with reference to FIGS. 6–11. The process then proceeds to Step 154 where the adjusted power levels are plotted versus frequency to produce a signal strength to frequency relationship. Such plots were graphically illustrated in FIGS. 8–11.

The process then proceeds to Step 156 where the signal strength to frequency relationship is compared with a desired signal strength to frequency relationship. The process then proceeds to Step 158 where a determination is made as to whether the comparison was favorable (i.e., matches within the tolerances of adjustment of the component). If yes, the process is complete. If not, the process proceeds to Step 160 where the component is tuned such that the signal strength to frequency relationship more closely resembles the desired signal strength to frequency relationship. The tuning may be done by tuning a resistor capacitor circuit, and inductor capacitor circuit or transconductance of a transistor. If the circuit includes multiple stages, each stage may be individually tuned.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for tuning an embedded circuit within an integrated circuit. By utilizing the step function of an RSSI module, power levels of frequency dependent control signals may be used to determine responses of the embedded components. By determining the responses of the embedded components, the components may be tuned to provide the desired response. As one of average skill in the art will appreciate, other embodiments may be derived from the teaching of the present invention, without deviating from the scope of the claims.

What is claimed is:

1. A method for direct tuning of a radio receiver, the method comprises:
   providing a plurality of frequency-dependent control input signals to an input of the radio receiver;
   for each of a plurality of frequency-dependent control input signals:
      determining received signal strength of a current one of the plurality of frequency-dependent control input signals to produce a measured received signal strength;
      determining whether the measured received signal strength is within a threshold of a known signal strength of the current one of the plurality of frequency-dependent control input signals;
      when the measured received signal strength is not within the threshold of the known signal strength of the current one of the plurality of frequency-dependent control input signals, incrementally adjusting gain of the radio receiver by a predetermined adjustment value until the measured received signal strength is within the threshold of the known signal strength of the current one of the plurality of frequency-dependent control input signals;
   determining response of the radio receiver based on the incrementally adjusting the gain of the radio when the measured received signal strength is not within the threshold of the known signal strength of the current one of the plurality of frequency-dependent control input signals to produce a determined response;
   comparing the determined response with a desired response of the radio receiver;
   when the determined response compares unfavorably with the desired response, determining a response offset based on a difference between the determined response and the desired response; and
   adjusting response of the radio receiver based on the response offset.

2. The method of claim 1, wherein the incrementally adjusting gain of the radio receiver further comprises:
   tuning a resistor-capacitor circuit of a filter, wherein the filter is one of a low pass filter, bandpass filter, high pass filter, or stop band filter.

3. The method of claim 2, wherein the tuning of the resistor-capacitor circuit further comprises:
   tuning capacitance of the resistor-capacitor circuit by enabling one or more switches of a switch-capacitor network.

4. The method of claim 2, wherein the tuning of the resistor-capacitor circuit further comprises:
   tuning resistance of the resistor-capacitor circuit by enabling one or more switches of a switch-resistor network.

5. The method of claim 2, wherein the tuning of the resistor-capacitor circuit further comprises:
   tuning a plurality of resistor-capacitor circuits, wherein each of the plurality of resistor-capacitor circuits is associated with a corresponding stage of the filter.

6. The method of claim 1, wherein the incrementally adjusting gain further comprises:
   tuning an inductor-capacitor circuit of a filter, wherein the filter is one of a low pass filter, bandpass filter, high pass filter, or stop band filter.

7. A radio receiver comprises:
   low noise amplifier operably coupled to amplify a radio frequency (RF) signal to produce an amplified RF signal therefrom;
   down conversion mixing module operably coupled to mix the amplified RF signal with a local oscillation to produce a low intermediate frequency (IF) signal;
   filter module operably coupled to filter the low IF signal to produce a filtered low IF signal;
   demodulation module operably coupled to recapture data from the filtered low IF signal;
   received signal strength indication module operably coupled to determine a received signal strength indication (RSSI) from the filtered low IF signal; and
   control module operably coupled to:
      providing a plurality of frequency-dependent control input signals to an input of the low noise amplifier;
      for each of a plurality of frequency-dependent control input signals:
         determining received signal strength of a current one of the plurality of frequency-dependent control input signals to produce a measured received signal strength;
         determining whether the measured received signal strength is within a threshold of a known signal strength of the current one of the plurality of frequency-dependent control input signals;
         when the measured received signal strength is not within the threshold of the known signal strength of the current one of the plurality of frequency-dependent control input signals, incrementally adjusting gain of the radio receiver by a predetermined adjustment value until the measured received signal strength is within the threshold of the known signal strength of the current one of the plurality of frequency-dependent control input signals;

determining response of the radio receiver based on the incrementally adjusting the gain of the radio when the measured received signal strength is not within the threshold of the known signal strength of the current one of the plurality of frequency-dependent control input signals to produce a determined response;

comparing the determined response with a desired response of the radio receiver;

when the determined response compares unfavorably with the desired response, determining a response offset based on a difference between the determined response and the desired response; and adjusting response of the radio receiver based on the response offset.

8. The radio receiver of claim 7, wherein the incrementally adjusting gain of the radio receiver further comprises:

tuning a resistor-capacitor circuit of the filter module, wherein the filter module is one of a low pass filter, bandpass filter, high pass filter, or stop band filter.

9. The radio receiver of claim 8, wherein the tuning of the resistor-capacitor circuit further comprises:

tuning capacitance of the resistor-capacitor circuit by enabling one or more switches of a switch-capacitor network.

10. The radio receiver of claim 8, wherein the tuning of the resistor-capacitor circuit further comprises:

tuning resistance of the resistor-capacitor circuit by enabling one or more switches of a switch-resistor network.

11. The radio receiver of claim 8, wherein the tuning of the resistor-capacitor circuit further comprises:

tuning a plurality of resistor-capacitor circuits, wherein each of the plurality of resistor-capacitor circuits is associated with a corresponding stage of the filter.

12. The radio receiver of claim 7, wherein the incrementally adjusting gain further comprises:

tuning an inductor-capacitor circuit of the filter module, wherein the filter module is one of a low pass filter, bandpass filter, high pass filter, or stop band filter.

* * * * *